United States Patent
Li et al.

(10) Patent No.: US 7,919,821 B2
(45) Date of Patent: Apr. 5, 2011

(54) METHOD AND INTEGRATED CIRCUITS CAPABLE OF SAVING LAYOUT AREAS

(75) Inventors: Yan-Nan Li, Taipei County (TW); Hsueh-Li Chiang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 191 days.

(21) Appl. No.: 12/100,394

(22) Filed: Apr. 9, 2008

(65) Prior Publication Data

US 2009/0179271 A1    Jul. 16, 2009

(30) Foreign Application Priority Data

Jan. 16, 2008 (TW) .............................. 97101626 A

(51) Int. Cl.
*H01L 29/43* (2006.01)
*H01L 29/49* (2006.01)
*H01L 29/92* (2006.01)

(52) U.S. Cl. ........ 257/381; 257/300; 257/360; 257/363; 257/379; 257/380; 257/E29.141; 257/E29.152; 257/E29.343

(58) Field of Classification Search .................. 257/300, 257/360, 363, 379, 380, 381, E29.141, E29.152, 257/E29.343
See application file for complete search history.

(56) References Cited

U.S. PATENT DOCUMENTS

| | | | | |
|---|---|---|---|---|
| 4,980,741 A | * | 12/1990 | Temple | 257/154 |
| 5,643,820 A | * | 7/1997 | Williams et al. | 438/394 |
| 6,188,056 B1 | * | 2/2001 | Kalnitsky et al. | 250/208.1 |
| 6,603,172 B1 | * | 8/2003 | Segawa et al. | 257/328 |
| 7,148,544 B2 | * | 12/2006 | Bhattacharyya | 257/350 |
| 7,183,611 B2 | * | 2/2007 | Bhattacharyya | 257/347 |
| 7,358,131 B2 | * | 4/2008 | Bhattacharyya | 438/232 |
| 2001/0011760 A1 | * | 8/2001 | Kim | 257/537 |
| 2001/0015449 A1 | * | 8/2001 | Nguyen et al. | 257/296 |
| 2003/0183880 A1 | * | 10/2003 | Goto et al. | 257/379 |
| 2005/0067626 A1 | * | 3/2005 | Lin | 257/84 |
| 2007/0296019 A1 | * | 12/2007 | Bertin et al. | 257/315 |

FOREIGN PATENT DOCUMENTS

KR    1020040082831    9/2004

* cited by examiner

*Primary Examiner* — Victor Mandala

(74) *Attorney, Agent, or Firm* — Winston Hsu; Scott Margo

(57) ABSTRACT

An integrated circuit includes a diffusion layer, a first poly-silicon layer, and a second poly-silicon layer. The first poly-silicon layer is located on the diffusion layer to form a transistor. The second poly-silicon includes a first section and a second section. The first section of the second poly-silicon layer is located on the first poly-silicon layer to form a capacitor. The second section of the second poly-silicon layer is located on the diffusion layer to form a resistor.

13 Claims, 5 Drawing Sheets

METHOD AND INTEGRATED CIRCUITS CAPABLE OF SAVING LAYOUT AREAS

BACKGROUND OF THE INVENTION

1. Field of the Invention

The present invention relates to a layout of an integrated circuit, and more particularly, to a layout of an integrated circuit capable of saving layout area.

2. Description of the Prior Art

With continued scaling-down of semiconductor integrated circuit (IC) device dimensions, not only are channel lengths being shortened, gate oxide layers becoming thinner, and junction depths getting shallower, but dopant concentrations are rising in deep submicron CMOS processes. All of these processes make IC products more susceptible to damage from electrostatic discharge (ESD). Consequently, more effective ESD protection circuits need to be built on-chip to discharge ESD-induced currents, and hence protect the IC against any ESD-related damage. In short, ESD robustness for IC products needs to be improved. To make an effective ESD protection circuit, an adequate ESD protection device must first be designed and manufactured into the ESD protection circuit. A very direct and effective way to increase the discharge path for ESD-induced current is enlarging the area of the ESD protection device. However, the chip area occupied by the ESD protection device should not be excessive, lest the ESD protection device prevent further size reductions to the chip.

Please refer to FIG. 1. FIG. 1 is a diagram of an ESD protection circuit according to the prior art. The ESD protection circuit 10 comprises a PMOS transistor 12, a resistor 14, and a capacitor 16. The resistor 14 is coupled between the gate and the source of the transistor 12. The capacitor 16 is coupled between the gate and the drain of the transistor 12. The resistor 14 and the capacitor 16 form a resistor-capacitor network (RC network). The source of the transistor 12 is coupled to a power supply, and the drain of the transistor 12 is coupled to a ground. When an electrostatic waveform occurs at the power supply, because of the signal delay effect due to the RC network, the rising rate of the voltage at node V1 is slower than the rising rate of the voltage at the power supply. Thus, a voltage difference occurs between the node V1 and the power supply. At the same time, the same voltage difference occurs between the transistor 12 and the power supply. When this voltage difference is greater than the threshold voltage of the transistor 12, the transistor 12 will turn on. Thus, the ESD protection circuit 10 can provide an ESD current path to avoid damage due to the current flowing into the internal circuits of an integrated circuit when the ESD event occurs. In addition, the ESD protection circuit can be formed with an NMOS transistor, and the operation of the ESD protection circuit formed with the PMOS transistor is similar to the ESD protection circuit 10.

Please refer to FIG. 2 and FIG. 3. FIG. 2 is a diagram of a first layout of the ESD protection circuit in FIG. 1 according to the prior art. FIG. 3 is a diagram of a second layout of the ESD protection circuit in FIG. 1 according to the prior art. As shown in FIG. 2, the transistor 12 is formed with a first poly-silicon layer 24 located above a diffusion layer 22. The capacitor 16 is formed with a second poly-silicon layer 26 located above the first poly-silicon layer 24. The resistor 14 is formed with the second poly-silicon layer 26. According to semiconductor processes, the diffusion layer 22, the first poly-silicon layer 24, and the second poly-silicon layer 26 are conductive layers, and each conductive layer is isolated by an oxide layer. Thus, each conductive layer is coupled with a contact window 28. In addition, the ESD protection circuit 10 has a pickup ring in the surroundings, and the pickup ring is formed with the diffusion layer 22. In order to release a large current, the transistor 12 of the ESD protection circuit 10 is formed with multiple bars of the first poly-silicon layer 24, and each bar of the first poly-silicon layer 24 is coupled with a metal layer (not shown). In FIG. 2, the transistor 12 formed with two bars of the first poly-silicon layer 24 is arranged in one area, and the resistor 14 and the capacitor 16 are arranged in the other area. Thus, the pickup ring forms two areas, one for the transistor 12 and the other for the resistor 14 and the capacitor 16. In FIG. 3, the transistor 12 is formed with eight bars of the first poly-silicon layer 24, and similarly, the pickup ring forms two areas, one for the transistor 12 and the other for the resistor 14 and the capacitor 16.

In conclusion, when the IC product is processed with the continued scaling-down of the dimensions, it is more susceptible to damage from ESD. To improve the ESD robustness of the IC product, enlarging the area of the ESD protection device provides a simple solution, but this always results in an increased layout area and a reduced integration.

SUMMARY OF THE INVENTION

According to an embodiment of the present invention, a method of forming an integrated circuit capable of saving layout area comprising: locating a first poly-silicon layer above a diffusion layer for forming a transistor; locating a second poly-silicon layer above the first poly-silicon layer for forming a capacitor; and locating the second poly-silicon layer above the diffusion layer for forming a resistor.

According to another embodiment of the present invention, an integrated circuit capable of saving layout area, the integrated circuit comprising: a diffusion layer; a first poly-silicon layer located above the diffusion layer for forming a transistor; and a second poly-silicon layer comprising: a first section located above the first poly-silicon layer for forming a capacitor; and a second section located above the diffusion layer for forming a resistor.

According to another embodiment of the present invention, an electrostatic discharge (ESD) protection circuit capable of saving layout area, the ESD protection circuit comprising: a transistor formed with a first poly-silicon layer located above a diffusion layer; a capacitor coupled between a gate and a drain of the transistor, the capacitor formed with a second poly-silicon layer located above the first poly-silicon layer; and a resistor coupled between the gate and a source of the transistor, the resistor formed with the second poly-silicon layer located above the diffusion layer.

These and other objectives of the present invention will no doubt become obvious to those of ordinary skill in the art after reading the following detailed description of the preferred embodiment that is illustrated in the various figures and drawings.

DETAILED DESCRIPTION

For an integrated circuit (IC) with a transistor, a capacitor, and a resistor, layout of the capacitor and the resistor can be arranged together with the transistor according to the present invention so as to save layout area. In the embodiments of the present invention, the ESD protection circuit is illustrated for an example; however, the present invention is adapted to the IC with the elements of the transistor, the capacitor, and the resistor. According to the present invention, the method of forming the IC comprises locating a first poly-silicon layer above a diffusion layer so as to form a transistor, locating a second poly-silicon layer above the first poly-silicon so as to form a capacitor, that is, utilizing the layout area of the gate of the transistor to form the capacitor, and locating the second poly-silicon layer above the diffusion layer so as to form a resistor, that is, utilizing the layout area of the active region of the transistor to form the resistor. Thus, the IC of the present invention comprises the diffusion layer, the first poly-silicon layer, and the second poly-silicon layer. The first poly-silicon layer is located above the diffusion layer to form the transistor. The second poly-silicon layer comprises a first section and a second section. The first section of the second poly-silicon layer is located above the first poly-silicon layer to form the capacitor. The second section of the second poly-silicon layer is located above the diffusion layer to form the resistor.

Figure 1:
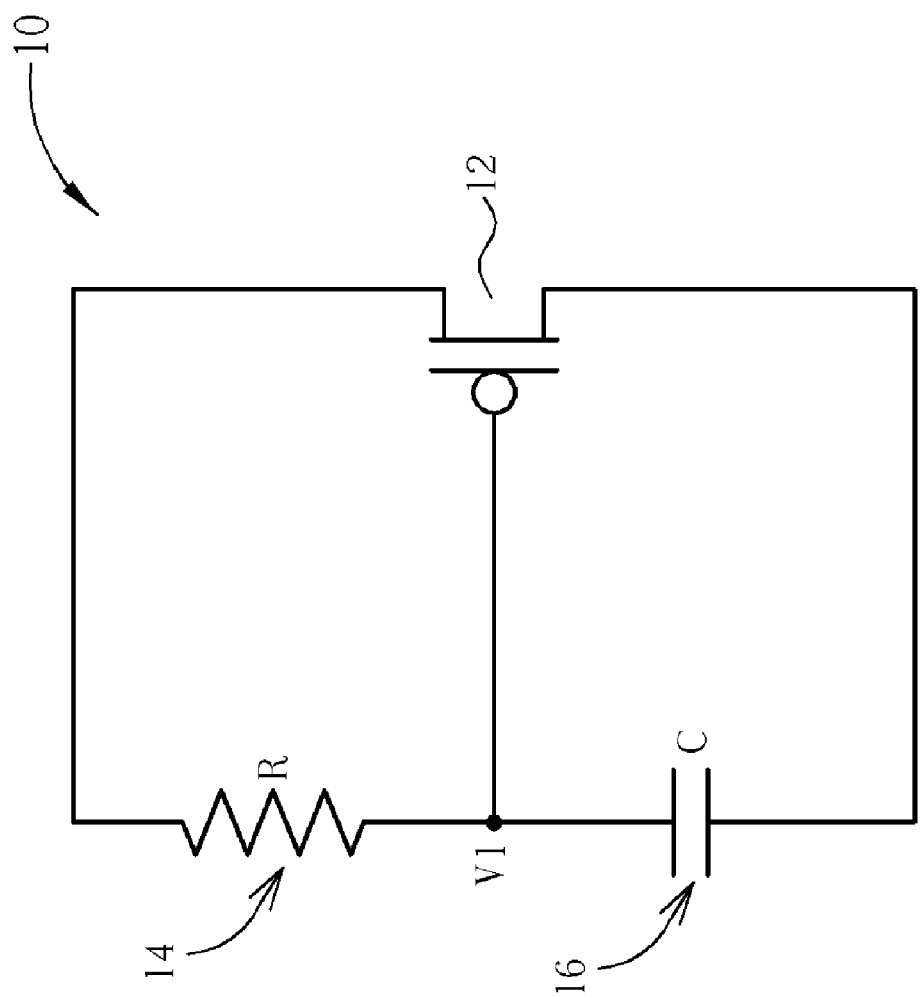
FIG. 1 is a diagram of an ESD protection circuit according to the prior art.
Figure 4:
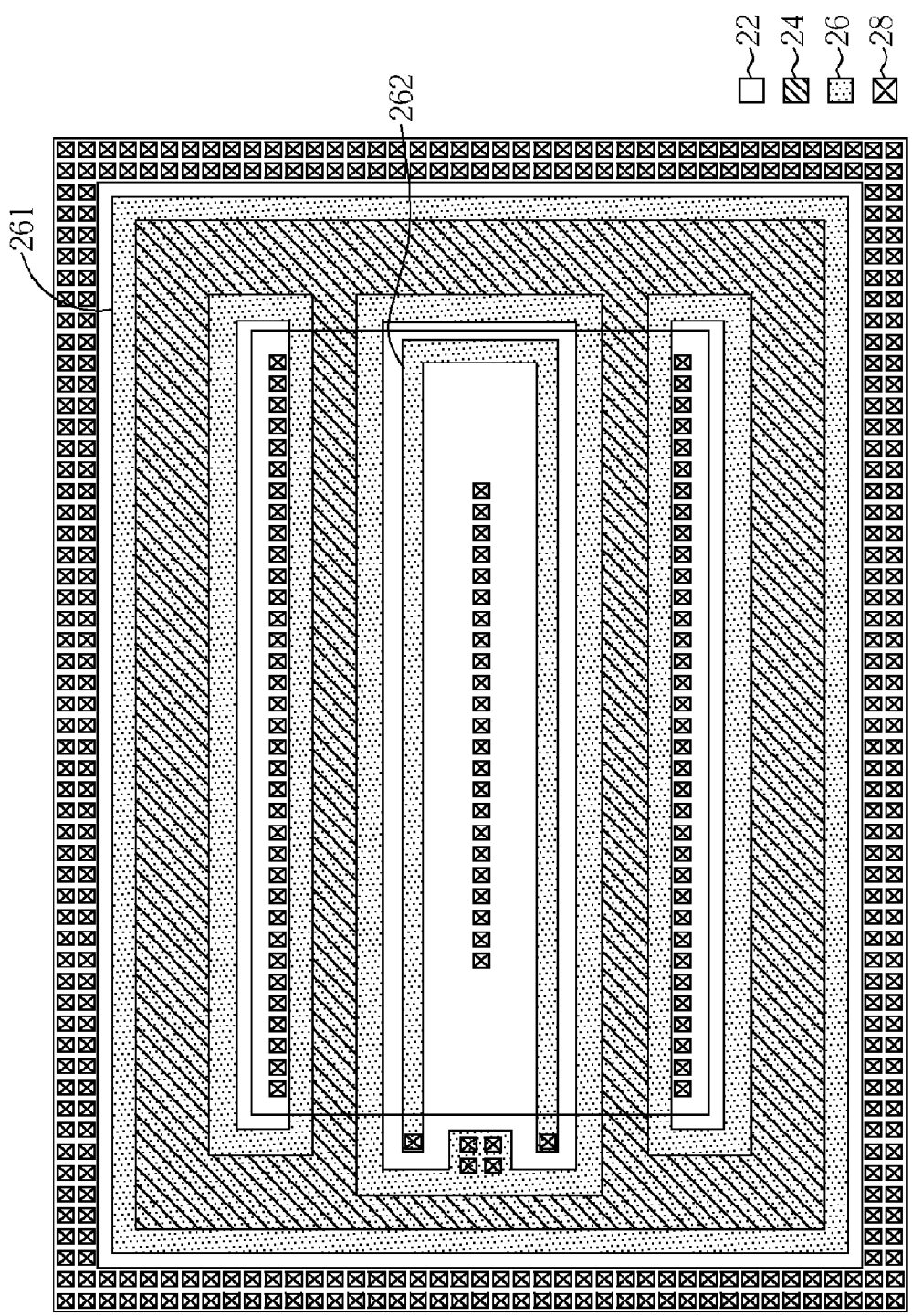
FIG. 4 is a diagram of a first layout of the ESD protection circuit in FIG. 1 according to the present invention.

Please refer to FIG. 4. FIG. 4 is a diagram of a first layout of the ESD protection circuit in FIG. 1 according to the present invention. The transistor 12 is formed with the first poly-silicon layer 24 located above the diffusion layer 22. The capacitor 16 is coupled between the gate and the drain of the transistor 12, which is formed with the second poly-silicon layer 26 located above the first poly-silicon layer 24. The resistor 14 is coupled between the gate and the source of the transistor 12, which is formed with the second poly-silicon layer 26 located above the diffusion layer 22. According to the semiconductor processes, the diffusion layer 22, the first poly-silicon layer 24, and the second poly-silicon layer 26 are conductive layers, and each conductive layer is isolated by an oxide layer. Thus, each conductive layer is coupled with a contact window 28. In addition, the ESD protection circuit 10 has a pickup ring in the surroundings, and the pickup ring is formed with the diffusion layer 22. In order to release a large current, the transistor 12 of the ESD protection circuit 10 is formed with multiple bars of the first poly-silicon layer 24, and each bar of the first poly-silicon layer 24 is coupled with a metal layer (not shown). In this embodiment, the transistor 12 is formed with two bars of the first poly-silicon layer 24. The second poly-silicon layer 26 comprises the first section 261 and the second section 262. The first section 261 is used for forming the capacitor 16, and the second section 262 of the second poly-silicon layer 26 is used for forming the resistor 14. In order to increase the capacitance of the capacitor 16, the first poly-silicon layer 24 is located above the diffusion layer 22 and extended to the area between the diffusion layer 22 and the pickup ring, and the second poly-silicon layer covers the complete first poly-silicon layer. Thus, the capacitance of the capacitor 16 is 970.64 pF, and the resistance of the resistor 14 is 2544 ohm.

Figure 2:
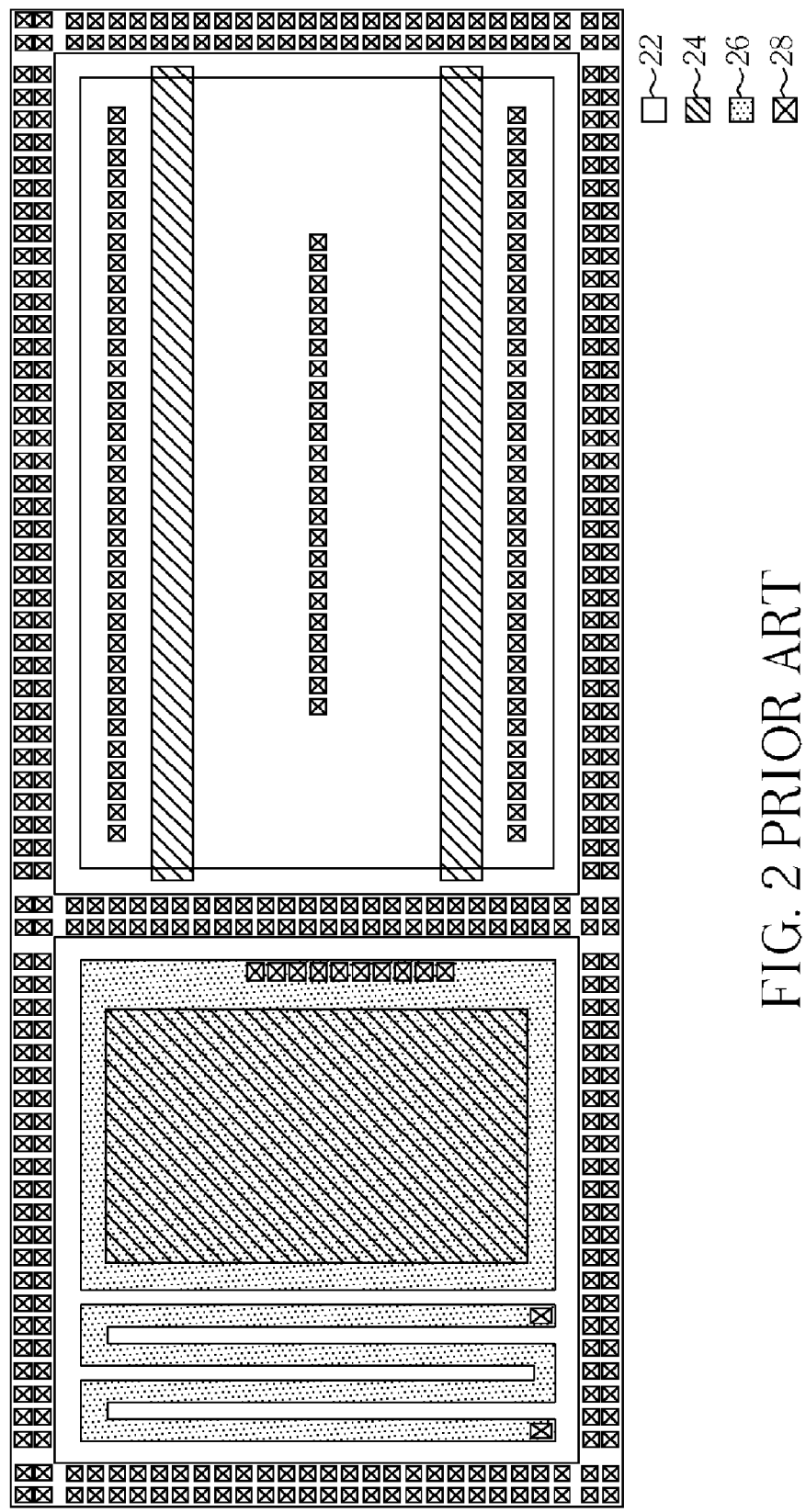
FIG. 2 is a diagram of a first layout of the ESD protection circuit in FIG. 1 according to the prior art.

In the semiconductor processes of the two poly-silicon layers, the first poly-silicon layer 24 and the second poly-silicon layer 26 form an upper plate and a lower plate respectively for the capacitor 16, so the capacitor 16 is located above the gate of the transistor 12 according to the present invention. In addition, the ESD protection circuit 10 has the pickup ring, and the distance between the pickup ring and the active region of the transistor 12 is greater than the minimum width of the poly-silicon layer, so the area between the pickup ring and the active region of the transistor 12 can be used to increase the capacitance of the capacitor 16 with no influence on the transistor 12. In addition, the drain and the gate of the transistor 12 of the ESD protection circuit 10 have a large distance, so this area can be used to arrange the layout of the resistor 14. To show the benefits of saving the layout area according to the present invention, the size of the layout in FIG. 2 and FIG. 4 are compared for the ESD protection circuit 10 in FIG. 1. In FIG. 2 and FIG. 4, the ESD protection circuit 10 utilizes two bars of the first poly-silicon layer 24 to form the transistor 12, and the size of the layout in FIG. 2 is 71.55 um*23 um=1645.65 um2, and the size of the layout in FIG. 4 is 43.9 um*31.9 um=1400.41 um2. Thus, the size of the layout in FIG. 4 saves 14.90% over that in FIG. 2.

Figure 3:
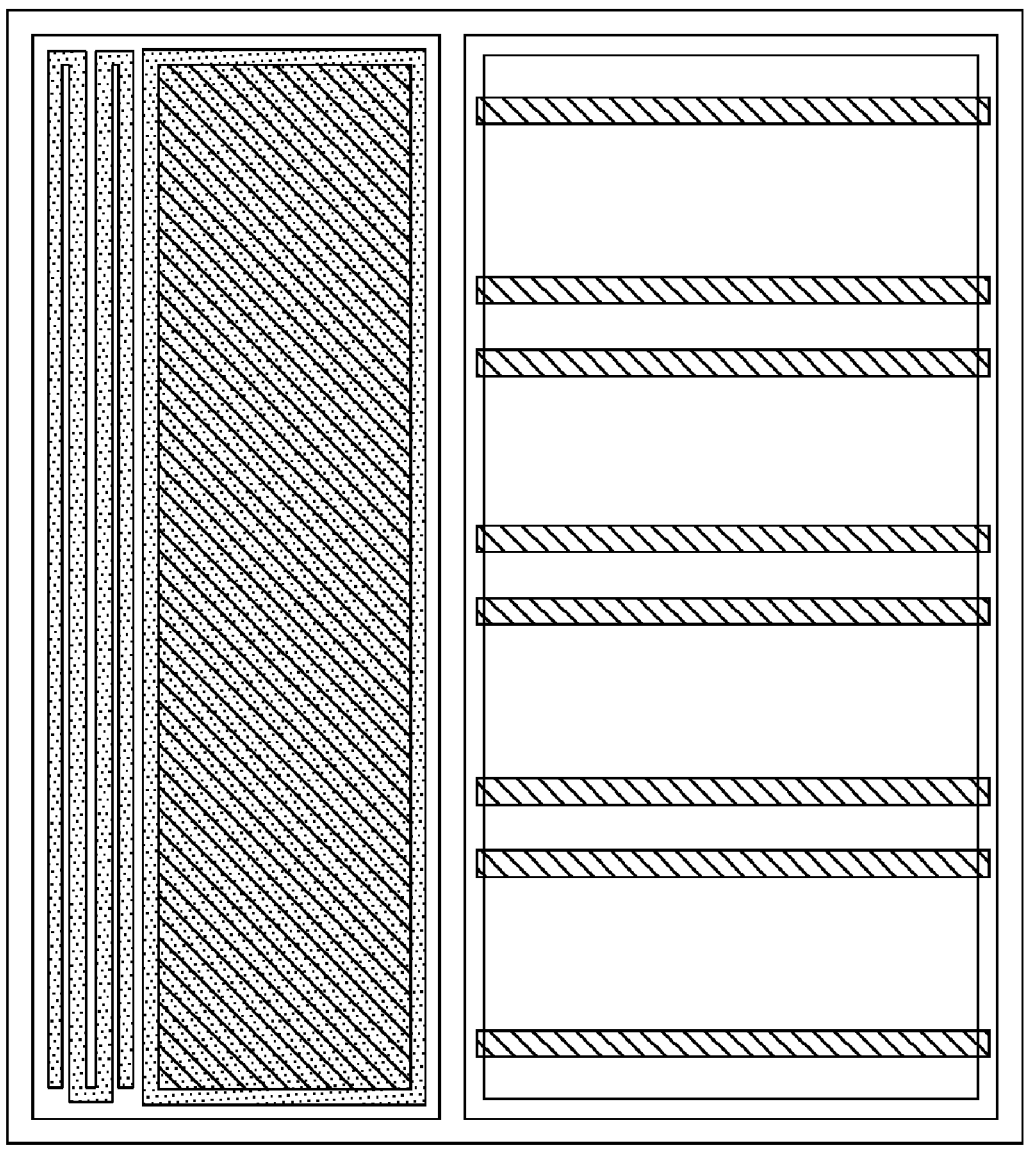
FIG. 3 is a diagram of a second layout of the ESD protection circuit in FIG. 1 according to the prior art.
Figure 5:
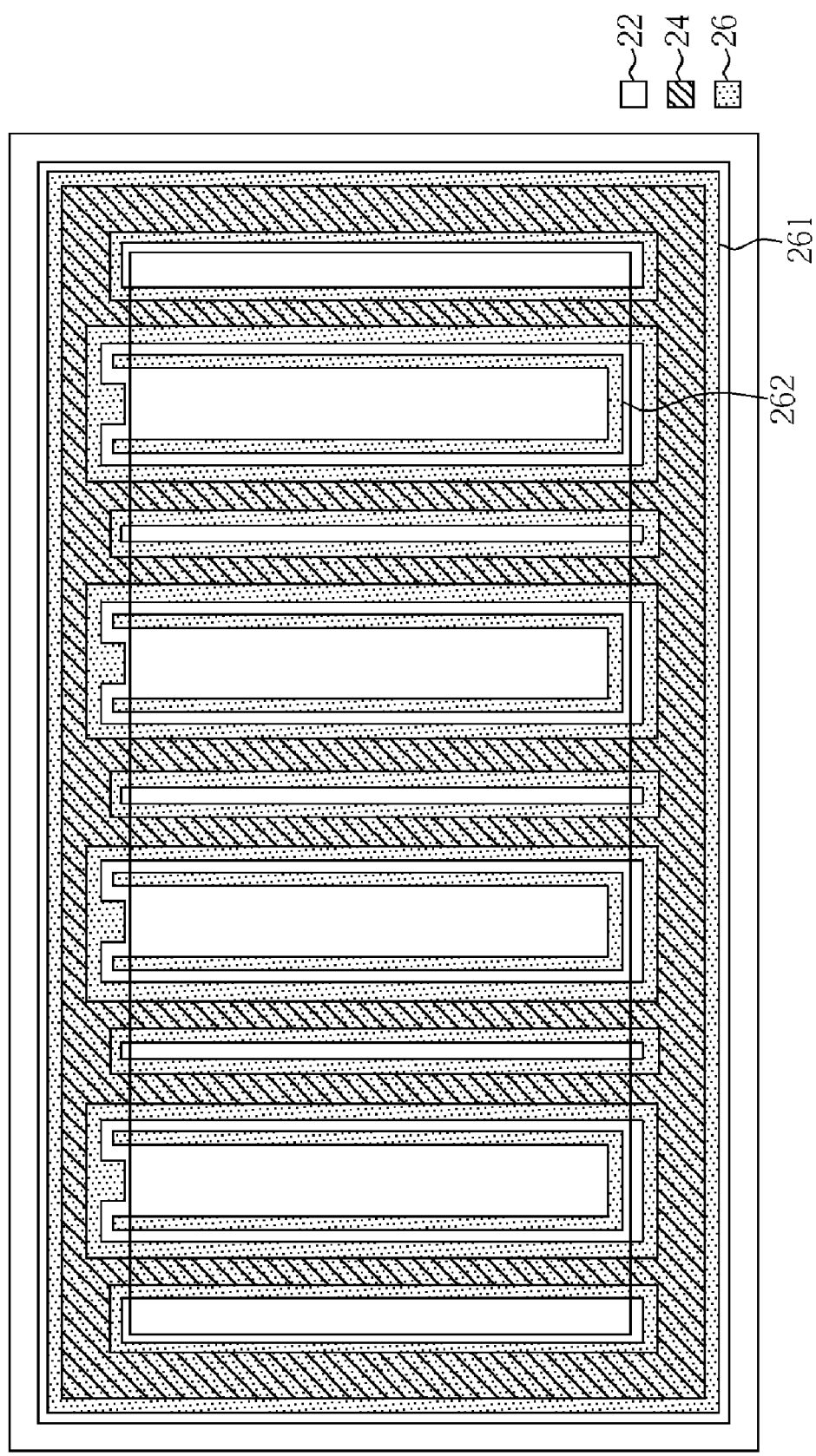
FIG. 5 is a diagram of a second layout of the ESD protection circuit in FIG. 1 according to the present invention.

Please refer to FIG. 5. FIG. 5 is a diagram of a second layout of the ESD protection circuit in FIG. 1 according to the present invention. In this embodiment, the transistor 12 is formed with eight bars of the first poly-silicon layer 24. The first section 261 of the second poly-silicon layer 26 is used for forming the capacitor 16, and the second section 262 of the second poly-silicon layer 26 is used for forming the resistor 14. The size of the layouts in FIG. 2 and FIG. 4 are compared for the ESD protection circuit 10 in FIG. 1. In FIG. 3 and FIG. 5, the ESD protection circuit 10 utilizes eight bars of the first poly-silicon layer 24 to form the transistor 12, and the size of the layout in FIG. 3 is 69.0 um*61.7 um=4257.30 um2, and the size of the layout in FIG. 5 is 77.9 um*44.3 um=3450.97 um2. Thus, the size of the layout in FIG. 5 is 18.93% lower than in FIG. 3.

In conclusion, the IC utilizes the layout areas of the transistor to add the layout of the capacitor and the resistor, so the size of the layout of the IC can be saved. For example, the ESD protection circuit comprises a transistor, a capacitor, and a resistor. The layout area of the gate of the transistor is used to form the capacitor, and the layout area of the active region of the transistor is used to form the resistor. Thus, the IC according to the present invention includes a diffusion layer, a first poly-silicon layer, and a second poly-silicon layer. The first poly-silicon layer is located on the diffusion layer to form the transistor. The second poly-silicon includes a first section and a second section. The first section of the second poly-silicon layer is located on the first poly-silicon layer to form the capacitor. The second section of the second poly-silicon layer is located on the diffusion layer to form the resistor.

Those skilled in the art will readily observe that numerous modifications and alterations of the device and method may be made while retaining the teachings of the invention.

What is claimed is:

1. An integrated circuit capable of saving layout area, the integrated circuit comprising:
   a diffusion layer;
   a first poly-silicon layer located above the diffusion layer for forming a transistor; and
   a second poly-silicon layer comprising:
      a first section located above the first poly-silicon layer for forming a capacitor with the first poly-silicon layer; and
      a second section located above the diffusion layer for forming a resistor.

2. The integrated circuit of claim 1, further comprising:
   a pickup ring, located around the diffusion layer.

3. The integrated circuit of claim 2, wherein the first poly-silicon layer is located above the diffusion layer and extended to an area between the diffusion layer and the pickup ring.

4. The integrated circuit of claim 3, wherein the first section of the second poly-silicon layer is located above the first poly-silicon layer and covers the complete first poly-silicon layer.

5. The integrated circuit of claim 1, wherein the capacitor is coupled between a gate and a drain of the transistor, the resistor is coupled between the gate and a source of the transistor, and the integrated circuit is an electrostatic discharge (ESD) protection circuit.

6. The integrated circuit of claim 1, wherein the first section of the second poly-silicon layer is located above an area of a gate of the transistor.

7. The integrated circuit of claim 1, wherein the second section of the second poly-silicon layer is located above an active region of the transistor.

8. The integrated circuit of claim 1 wherein the layout area of a gate of the transistor forms a plate of the capacitor.

9. An electrostatic discharge (ESD) protection circuit capable of saving layout area, the ESD protection circuit comprising:

a transistor formed with a first poly-silicon layer located above a diffusion layer;

a capacitor coupled between a gate and a drain of the transistor, the capacitor formed with a second poly-silicon layer located above the first poly-silicon layer; and a resistor coupled between the gate and a source of the transistor, the resistor formed with the second poly-silicon layer located above the diffusion layer.

10. The ESD protection circuit of claim 9, further comprising:

a pickup ring located around the diffusion layer of the transistor.

11. The ESD protection circuit of claim 9, wherein the second poly-silicon layer and the first poly-silicon layer of the capacitor are extended to an area between the diffusion layer and the pickup ring of the transistor.

12. The ESD protection circuit of claim 9, wherein the capacitor is located above an area of the gate of the transistor.

13. The ESD protection circuit of claim 9, wherein the resistor is located above an active region of the transistor.

* * * * *